United States Patent [19]
Rosen et al.

[11] Patent Number: 6,027,246
[45] Date of Patent: Feb. 22, 2000

[54] MONOCRYSTAL OF NICKEL-COBALT-MANGANESE-COPPER OXIDE HAVING CUBIC SPINEL STRUCTURE AND THERMISTOR FORMED THEREFROM

[75] Inventors: Carol Zwick Rosen, Teaneck, N.J.; Donald G. Wickham, Malibu, Calif.

[73] Assignee: Thermometrics, Inc., Edison, N.J.

[21] Appl. No.: 08/991,176

[22] Filed: Dec. 16, 1997

Related U.S. Application Data

[63] Continuation-in-part of application No. 08/877,774, Jun. 17, 1997.

[51] Int. Cl.⁷ .......................... G01K 7/22; C01G 53/04; C01G 45/02
[52] U.S. Cl. .......................... 374/185; 423/599; 423/594; 338/22 R; 338/22 SD
[58] Field of Search .................... 423/594, 599; 117/41, 78, 946; 374/185; 338/22 R, 22 SD

[56] References Cited

U.S. PATENT DOCUMENTS

| | | |
|---|---|---|
| 2,645,700 | 7/1953 | Morin ......................................... 201/63 |
| 2,850,355 | 9/1958 | Linz, Jr. et al. ............................. 23/51 |
| 2,962,680 | 11/1960 | Sidaris ........................................ 338/9 |
| 3,343,151 | 9/1967 | Brown et al. . |
| 3,510,820 | 5/1970 | Jonker et al. . |
| 3,568,125 | 3/1971 | Villemant et al. . |
| 3,612,535 | 10/1971 | Davis et al. . |
| 3,846,776 | 11/1974 | Kahn . |
| 3,876,382 | 4/1975 | Falckenberg . |
| 4,324,702 | 4/1982 | Matsuo et al. . |
| 4,347,166 | 8/1982 | Tosaki et al. . |
| 4,519,870 | 5/1985 | Matsuzawa et al. . |
| 4,729,852 | 3/1988 | Hata . |
| 4,840,925 | 6/1989 | Rousset et al. . |
| 4,891,158 | 1/1990 | Hata . |
| 4,906,821 | 3/1990 | Bechevet et al. ........................ 219/521 |
| 5,043,692 | 8/1991 | Sites et al. . |
| 5,246,628 | 9/1993 | Jung et al. . |
| 5,574,106 | 11/1996 | Allen ....................................... 525/183 |
| 5,653,954 | 8/1997 | Rosen et al. . |
| 5,705,562 | 1/1998 | Hill ......................................... 524/731 |
| 5,879,655 | 3/1999 | Miller et al. ............................. 423/702 |

FOREIGN PATENT DOCUMENTS

| | | |
|---|---|---|
| 0 609 776 A1 | 8/1994 | European Pat. Off. . |
| 0 687 656 A1 | 12/1995 | European Pat. Off. . |
| 2-143502 | 6/1990 | Japan . |
| 3-136206 | 6/1991 | Japan . |
| 3-214702 | 9/1991 | Japan . |
| 3-214703 | 9/1991 | Japan . |

OTHER PUBLICATIONS

E.G. Larson and R.J. Arnott, Preparation, Semiconduction and Low–Temperature Magnetization of the System $Ni_{1-x}Mn_{2+x}O_4$ J. Phys. Chem. Solids, Pergamon Press 1962, vol. 23, pp. 1771–1781.

H. Makram, "Growth of Nickel Manganite Single Crystals," Journal of Crystal Growth 1, 1967, North–Holland Publishing Co., Amsterdam, pp. 325–326.

D.G. Wickham, Solid–Phase Equilibria in the System $NiO-Mn_2O_3-O_2$, J. Inorg. Nucl. Chem., Pergamon Press Ltd. 1964, vol. 26, pp. 1369–1377.

(List continued on next page.)

Primary Examiner—Diego Gutierrez
Assistant Examiner—Maria Fernandez
Attorney, Agent, or Firm—Lerner, David, Littenberg, Krumholz & Mentlik, LLP

[57] ABSTRACT

Monocrystalline nickel-cobalt-manganese-copper oxide having a cubic spinel structure over a broad range of concentration ratios of manganese/cobalt/nickel/copper, including methods of producing such monocrystals, particularly those having a quaternary cubic spinel structure. Sensors having desirable electrical properties are disclosed, which sensors comprise at least a portion of such monocrystals. In particular, such sensors are highly accurate temperature sensors or thermistors having high sensitivity, good reproducibility and improved aging characteristics.

12 Claims, 2 Drawing Sheets

OTHER PUBLICATIONS

D.G. Wickham, "The Chemical Composition of Spinels In The System $Fe_3O_4$–$Mn_3O_4$," *J. Inorg. Nucl. Chem.*, 1969, vol. 31, pp. 313–320, Pergamon Press.

A.E. Paladino, Jr., "Phase Equilibria in the Ferrite Region of the System Fe–Ni–O," *Journal of the American Ceramic Society–Paladino*, vol. 42, No. 4, pp. 168–175. (1959).

Leonid V. Azároff, "Formation, structure, and bonding of Ni–Co–Mn oxides having spinel type strukture," *Zietschrift für Kristallographice*, Bd. 112, S. 33–43 (1959).

J. Ross Macdonald, *Impedance Spectrscopy—Emphasizing Solid Materials and Systems*, pp. 1–26. (no date).

Takashi Yokoyama et al., "Formation of Mono Phase Cubic Spinel Consisting of Mn, Co and Ni Oxide and its Electrical Properties," *Journal of the Materials Science Society of Japan*, vol. 28, No. 5, 1991, pp. 271–275.

Takashi Yokoyama et al., "Influence of Firing Atmosphere on Crystal Structures of Mn–Co–Ni Oxide for Thermistor Material," *Journal of the Ceramic Society of Japan, International Edition*, vol. 97, No. 4, Apr. 1989, pp. 417–422.

T. Sasamoto et al., "Crystal Structure and Electrical Property of Mn–Fe–Co–Ni Oxide For Thermistor Materials in the Manufacture Process," *Key Engineering Materials*, Trans Tech Publications, Switzerland, 1991, vols. 53–55, pp. 101–106.

T. Yokoyama et al., "Preparation and electrical properties of monophase cubic spinel, $Mn_{1.5}Co_{0.95}Ni_{0.55}O_4$, derived from rock salt type oxide," *Journal of Materials Science*, Chapman and Hall (1995), vol. 30, pp. 1845–1848.

V.A.M. Brabers and J.C.J.M. Terhell, "Electrical Conductivity and Cation Valencies in Nickel Manganite," Department of Physics, University of Technology, Eindhonen, The Netherlands, 1982, pp. 325–332.

G. Villers & R. Buhl, "Preparation, etudes cristallines et magnetiques du manganite de nickel $NiMn_2O_2$," C.R. Acad. Sc. Paris, t. 260, 1965, Groupe 8, pp. 3406–3409.

K. J. Standley, "Electrical Properties of Ferrites and Garnets," *Oxide Magnetic Materials*, Second Edition, Clarendon Press Oxford 1972, pp. 140–143.

Suzuki, "a.c. Hopping conduction in Mn–Co–Ni–Cu complex Oxide Semiconductors with Spinel Structure" The journal of physics and chemistry of solids vol. 41 pp. 1253–1260, 1980.

MONOCRYSTAL OF NICKEL-COBALT-MANGANESE-COPPER OXIDE HAVING CUBIC SPINEL STRUCTURE AND THERMISTOR FORMED THEREFROM

The present application is a continuation-in-part of U.S. application Ser. No. 877,774, which was filed on Jun. 17, 1997, entitled "Method of Making Wafer Based Sensors and Wafer Chip Sensors," the entirety of which is hereby incorporated by reference as part of this application.

FIELD OF THE INVENTION

The invention relates to the field of growing monocrystals, particularly of nickel-cobalt-manganese-copper-oxide with a quaternary cubic spinel structure and methods of their production and their use.

BACKGROUND OF THE INVENTION

Monocrystalline materials may offer a high degree of uniformity in terms of their physical properties as well as a high degree of repeatability and efficiency when compared to polycrystalline ceramic materials (polycrystals) of the same material. Such, monocrystals or single crystals, if producible at all, may be highly prized as replacements for corresponding polycrystalline materials wherever such materials are used. Moreover, because of their anticipated desirable properties, monocrystalline materials are sought out for applications for which polycrystalline material would never be considered. For example, in optical applications, polycrystals will provide a diffuse reflection of incident light whereas monocrystals would yield specular reflection.

In accordance with the present invention, and indeed generally, monocrystals can be differentiated from polycrystals based on a number of factors. Monocrystals are sized and shaped such that they can be used individually in the production of sensors, probes and the like. Polycrystalline materials are those made up of a composite of many individual crystals. Many ceramic materials are polycrystalline in nature as are many rocks and fabricated metals. The size of crystallites in polycrystalline material are usually small with equivalent diameters in many materials varying from a few micrometers to about 100 micrometers. Because of physical properties such as, for example, packing density and other issues common in the ceramics field, it is usually advantageous to insure that the individual crystals remain small and are of as uniform a size and composition as possible.

There are other significant differences as well, most of which stem directly from the fact that monocrystals are, as their name implies, singular, whereas polycrystals involve the interaction of at least two crystals and suffer from charge carrier scattering at their grain boundaries, where modifications to the electric conductivity likely takes place. In fact, transport processes such as electric and thermal conductivities and dielectric properties of the crystal differ considerably from those of ceramic samples.

Polycrystalline ceramic materials can be thought of as a composite material made up of two or more distinct individual crystals but usually a large number of crystals. Just as the polycrystalline materials are composites of the individual crystals, so too are their properties. Polycrystals have voids and often two or more stoichiometries and phases. These features each have an effect on the overall properties of the material and any device or sensor made using them. For example, the dielectric tensor of semiconducting polycrystalline materials is less than that of the corresponding semiconducting monocrystal of that same material because of the presence of voids. The resistivity (inverse electric conductivity) and the thermal conductivity of the polycrystalline material is also affected thereby. Monocrystals, which do not suffer from such composite properties will not exhibit such a strong dispersion in their impedance-frequency characteristics. See E. G. Larson, R. J. Arnott, D. G. Wickham, "Preparation, Semiconduction and Low Temperature Magnetization of the System $Ni_{1-x}Mn_{2+x}O_4$", J. Physics and Chemistry Solids, Vol. 23, (1962), 1771–1781.[1] See also Oxide Magnetic Materials, K. J. Standley, Monographs on the Physics and Chemistry of Materials. 2 ed. Clarendon Press. Oxford (1972), pp. 140–141.[2]

Moreover, since no two groups of polycrystals can be exactly the same, i.e., same number of crystals of identical size, orientation, stoichiometry and composite properties, even within the same lot, the response of one sensor made with one group of polycrystals may vary with respect to other such sensors. Polycrystals may also be problematic because they may absorb water, particularly in the voids between crystals. When such material is exposed to variations in humidity, "aging" or a lack of reproducibility of properties over time and/or temperature may be accelerated and greater in comparison to comparable monocrystals. Moreover, the size of the voids between individual crystals may change with time and exposure to the elements and in response to external electric fields. Again, the thermal and electrical properties of the resulting material may therefore change over time. Monocrystals do not suffer from these same aging limitations.

Finally, with regard to certain materials and in particular cubic spinel crystals, there may be magnetic ordering effects over temperature in monocrystals. But with polycrystals, exposure to a magnetic field may cause movement of the individual crystals. This would result in a change in the grain boundaries and the size and shape of any voids and lead to hysteretic effects. The composite properties of the material would change accordingly. Certainly, the magnetic, thermal and electric properties of monocrystals can be more accurately measured and more repeatedly relied upon than polycrystalline materials.

Polycrystals of nickel manganese oxide are known, see D. G. Wickham, "Solid-Phase Equilibria In The System $NiO$—$Mn_2O_3$—$O_2$," J. Inorg. Nucl. Chem., 26, (1964), 1369–1377 [3], as are monocrystals of this system. See Rosen et al., U.S. Pat. No. 5,653,954, the text of which is hereby incorporated by reference and attached. Polycrystals of nickel-cobalt-manganese are also known to exist. For example, polycrystalline materials of nickel-cobalt-manganese oxides were reported by L. V. Azaroff, see Z. Kristallogr., volume 112, pages 33–43, (1959). However, monocrystals of nickel-cobalt-manganese oxide and nickel-iron-manganese oxide were unknown until their invention by the present inventors. See Rosen et al., U.S. patent application Ser. No. 08/877,415, filed Jun. 17, 1997 and titled Growth of Nickel-Cobalt-Manganese Oxide Single Crystals. See also Rosen et al., U.S. patent application Ser. No. 919,372, filed Aug. 22, 1997, and titled Growth Of Nickel-Iron-Manganese Oxide Single Crystals.

Despite the success the inventors achieved throughout the growth of other nickel-manganese oxide containing crystals, there was no way to predict how the introduction of different variables to the system (namely cobalt and/or copper) would affect the ability to produce monocrystals or their comparative properties to the corresponding polycrystals. There is simply no way to predict what the result would be. In addition, there is no known way to manufacture these monocrystals. The mere fact that polycrystals containing some or all of these oxides exist does not mean that the methods used to make the ceramics are applicable to the growth of quaternary cubic spinel monocrystals. For example, while polycrystalline materials are known for the nickel-manganese-cobalt-copper oxide system, they do not consist of a single phase. Merely assuming that the method used to produce materials of this type could be utilized to grow monocrystals is not plausible.

SUMMARY OF THE INVENTION

The proposed invention provides monocrystalline nickel-copper-cobalt-manganese oxide having a cubic spinel structure. In particular, the present invention provides such crystals over a full cubic spinel range of manganese/cobalt/nickel/copper ratios. These compositions can be represented by the region of solid solutions within and, where appropriate, including the sides of the polygon shown in FIG. 1 (i.e., polygon ABCDEA).

The monocrystals desired have a quaternary cubic spinel structure and an atomic ratio $R[R=Mn/(Mn+Ni+Co+Cu)]$ which ranges from between about zero to about 0.87 based on the amount of manganese. Corresponding R values based on nickel, cobalt and/or copper are also contemplated.

Most preferred are the monocrystals which occur in the region of FIG. 1 bounded by the polygon QRSTQ.

In other aspects of the present invention, there are also provided a number of methods of producing nickel-cobalt-manganese-copper oxide monocrystals along the entire possible range of manganese to nickel to cobalt to copper ratios, such that the resulting crystals have a quaternary cubic spinel structure.

The invention also provides various methods of producing quaternary cubic spinel monocrystals of nickel-cobalt-manganese-copper oxide from known or determined amounts of starting materials.

Finally, in accordance with the present invention unique and advantageous sensors using at least a portion of a nickel-cobalt-manganese-copper oxide monocrystal having a cubic spinel structure as described herein are provided. Various devices which use such sensors and methods of their use are also contemplated.

By use of the methods of the present invention, one can produce monocrystals of nickel-cobalt-manganese-copper oxide having a cubic spinel structure and very advantageous and useful electrical properties. The monocrystals do not suffer from many of the limitations and disadvantages of polycrystalline or ceramic materials, even those made from the same elements. Moreover, by the practice of the present invention, one is able to produce crystals over a range of manganese to nickel to cobalt to copper ratios.

A relationship exists between the starting materials useful for producing monocrystals of nickel-cobalt-manganese-copper oxide and the expected crystals. Given this fact, one can preselect starting materials that will yield crystals with a desired set of physical properties.

It is also possible, in accordance with the present invention, to provide highly accurate temperature sensors or thermistors which provide significant advantages such as a high sensitivity, good reproducibility and better aging characteristics.

DETAILED DESCRIPTION OF THE PREFERRED EMBODIMENTS

Figure 1:
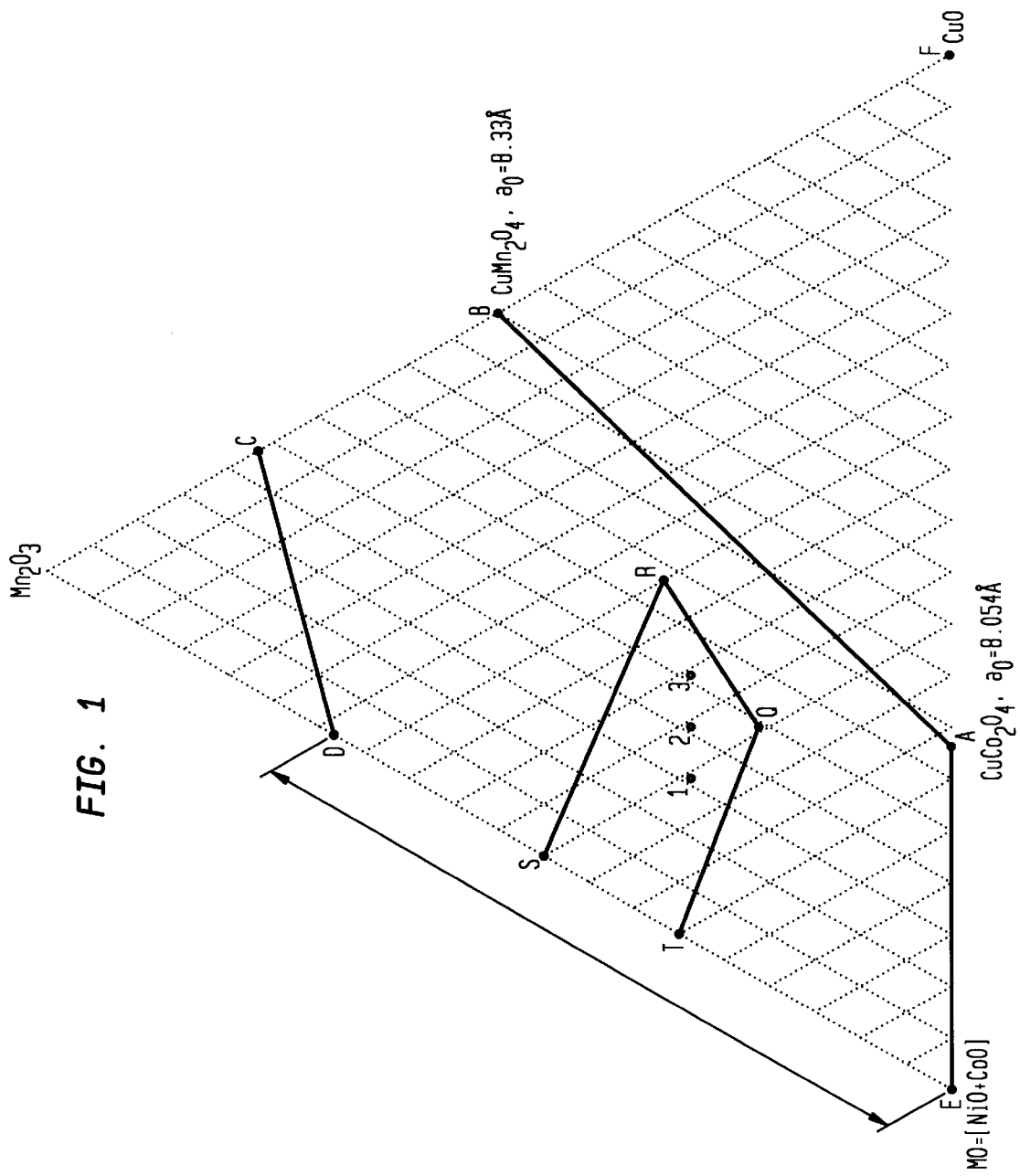
FIG. 1 is a composition diagram of solute points (1,2,3) in the [$NiO-Mn_2O_3-CoO-CuO$] system.

In the context of the present invention, when referring to a single crystal, or monocrystal, an isolated crystal which is large enough to individually manipulate is envisioned. Preferably, individual crystals are desirably at least about a millimeter in size or greater, along one edge. Crystals of a centimeter on a single edge, and larger, are desirable for many applications. These crystals are preferably cubic spinels. Cubic spinel crystals, such as the crystals of the present invention, provide isotropic properties. For example, transport processes, such as electric conductivity, are isotropic. Quaternary cubic spinels are most preferred.

One method of growing the monocrystals of the present invention is the so-called "flux growth" method. In accordance with the flux growth method, nickel, cobalt, copper and manganese oxides are charged, along with a $Bi_2O_3/B_2O_3$ flux into a platinum crucible. The bismuth and boron oxides are collectively referred to herein as the flux. The crucible and its contents are placed into a furnace, preferably one having a carousel or other device to insure that each crucible receives the same thermal treatment, and the mixture is heated to a specific melt temperature. The mixture is held at that melt temperature, also referred to herein as the "top temperature" or "first elevated temperature," for a period of time sufficient to completely form a solution of the starting materials and, ideally, to eliminate the presence of particles which can act as seeds for uncontrolled crystal growth. This extended maintenance of the first elevated temperature is often termed "soaking," and soaking can last from between 6 to about 100 hours, or more if necessary. The highest elevated temperature of the system must be high enough to dissolve all the components. However, the highest elevated temperature cannot be so high that, for example, too much of the relatively low melting point flux evaporates.

After soaking the crucibles are gradually cooled to a "second elevated temperature" also known as the "bottom temperature," during which time crystal development and growth is expected. Within reason, the more gradual the cooling rate, the larger the resulting crystals. Finally, at the bottom temperature, the crucibles are removed from the oven and cooled to room temperature. Thereafter, the crystals are separated from the bismuth/boron oxide flux, cleaned and inspected.

The amounts of nickel oxide, manganese oxide, cobalt oxide and/or copper oxide, as well as the amounts of bismuth oxide and boron oxide useful in accordance with the proposed invention may vary depending upon a number of factors, including the size of the crystals wanted, the desired ratio of manganese to nickel to cobalt to copper, the size of the production run and the like. A relationship is assumed to exist between the composition of the melt and the composition of the expected crystals.

The amount of flux used is generally not critical to the invention. The amount of flux must be sufficient to completely dissolve all the constituents and should be sufficient to allow for good homogenous mixing of all of the chemical species. Sufficient flux should also be provided so as to assure complete solution at the top temperatures used. To accomplish this, at least about 50 Mol % of flux should generally be provided. The melt should not be too dilute.

$B_2O_3$ in the flux may range from between about 5 Mol % to about 50 Mol %, and more preferably from about 15 Mol % to about 25 Mol % of the flux. There is a eutectic at about 19–20 Mol % $B_2O_3$ of 622° C.[(4)]. This provides a good flux because it provides the lowest melting point and the greatest temperature range through which crystals may grow.

The melt used generally has a top temperature of 1350° C. A preferred melt temperature is about 1280° C. However, that temperature is by no means the upper limit for the first elevated temperature. In fact, any temperature which is suitable for a given flux and which causes the dissolution of all of the components while, at the same time, providing a relatively stable system may be utilized. Top temperatures in this system may be limited by the volatility of the $Bi_2O_3$ which varies with the composition of the melt. In accordance with the present invention, this first elevated temperature may range from between about 1200° C. to about 1400° C. and preferably from between about 1250° C. to about 1350° C. and more preferably from between about 1260° C. to about 1320° C.

Crystal growth occurs during the cooling from the first elevated temperature to the second elevated temperature. If the ratios of ingredients and the temperatures are correct, then, quaternary cubic spinel single crystals of nickel-cobalt-manganese-copper oxide result. In general, the longer that the material is allowed to cool to the second elevated temperature, i.e., the more gradual the cooling, the larger the crystals. Melts have successfully been cooled at a rate of approximately 0.6° C. per hour from 1280° C. to 860° C. However, to promote the growth of even larger crystals, it may be desirable to decrease the cooling rate and/or extend the cooling time. Alternatively and/or in addition thereto, the quenching or cooling temperatures may be adjusted to provide a longer cooling period. In general, the cooling rate should range from between about 0.3 to about 5° C./hour and preferably between about 0.6 and about 1.0° C./hours.

Once the second elevated temperature is reached, the crystals are cooled to ambient temperature. Cooling involves rapidly lowering the temperature so as to stop crystal formation in such a way that only the crystals of the desirable structure result. The process should yield crystals which may be freed from the bulk of the flux by any known means. One way to accomplish extraction is to use acids such as 10 Vol % nitric acid or 10–20 Vol %. acetic acid. The crystals are then typically removed, weighed and measured.

The monocrystals should be examined by x-ray diffraction and chemically analyzed for nickel, cobalt, manganese and copper content (including possible impurities). The cubic spinel structure should be verified and the lattice constant along with its formulated chemical composition should be used to calculate the x-ray density for each specimen. Prior to this, the specimens should be weighed and measured and several resistance temperature measurements should be taken to determine their expected resistivity temperature characteristics.

Monocrystals produced in accordance with the present invention are composed of nickel, manganese, cobalt and copper oxides, preferably have a cubic spinel structure with an atomic ratio $R[R=Mn/(Mn+Ni+CoO+CuO)]$ which ranges from between about zero to about 0.87 based on the amount of manganese. Corresponding R values based on nickel, cobalt and/or copper are also contemplated. The nickel-cobalt-manganese-copper oxide monocrystals of the invention can also be described by reference to their composition.

The ratio of the starting materials in the initial melt and the ratio of nickel, cobalt, copper and manganese in the resulting crystals within the boundary conditions shown in FIG. 1 and defined by the points in Table 1 can be determined. Knowing same allows one to tailor make cubic spinel crystals of nickel-cobalt-manganese-copper oxide of any desired nickel to cobalt to manganese to copper ratios within the boundary compositions for a quaternary cubic spinel structure as illustrated in FIG. 1 (Generally the region bounded by a polygon connecting points ABCDEA). This can be accomplished by varying the amounts of starting materials. Table 1 provides the amounts of materials defined given in Mol % by the points along the boundaries described above. Therefore, when designing quaternary cubic spinel monocrystals in accordance with the present invention, it is important to select amounts which fall within or along these boundary values as appropriate. The result will be a quaternary cubic spinel monocrystal containing nickel, copper, cobalt and manganese oxides bounded by the polygon (ABCDEA) in FIG. 1.

TABLE 1

(C123) VALUES OF THE POINTS IN FIG. 1

| Pts. (m/o) | [NiO] | [CoO] | [MO] [NiO + CoO] | [$Mn_2O_3$] | [CuO] |
|---|---|---|---|---|---|
| (1) | 19.1489 | 36.1702 | 55.3191 | 27.6596 | 17.0213 |
| (2) | 17.0213 | 34.0426 | 51.0639 | 27.6596 | 21.2766 |
| (3) | 14.8936 | 31.9149 | 46.8085 | 27.6596 | 25.5319 |
| (Q) | | | 55.06 | 20.00 | 25.00 |
| (R) | | | 35.00 | 32.00 | 33.00 |
| (S) | | | 55.00 | 45.00 | 0.00 |
| (T) | | | 70.00 | 30.00 | 0.00 |
| (A) | | | 66.67 | 0.00 | 33.33 |
| (B) | | | 0.00 | 50.00 | 50.00 |
| (C) | | | 0.00 | 76.47 | 23.53 |
| (D) | | | 32.36 | 67.64 | 0.00 |
| (E) | | | 100.00 | 0.00 | 0.00 |

* points in FIG. 1 - "(m/o" = Mol %)

The embodiments shown in FIG. 1 presents an area in a composition diagram for the cubic spinel system with formula $X_3O_4$. Manganese oxide, copper oxide and nickel and cobalt oxides (NiO+CoO=MO) are the three coordinates. The area (QRSTQ) includes compositions which can be obtained at 25° C. with cubic spinel structure. Crystals obtained by methods described herein have compositions also within the area (QRSTQ). Crystals with compositions in the area (TEABCDSRQT) can also be produced with modifications in procedure such as use of ambient oxygen pressure, ratio of constituents, NiO, CoO, $Mn_2O_3$ and CuO in the melt, and adjustment of the temperature program. Note that while the discussions and calculations in this document are predicated on specific oxides of Co, Mn, Ni and Cu, other oxides of may be substituted. The term "oxide" as used herein is meant to encompass all relavant oxides for a given element.

Some of the points along the lines forming the boundary of the polygon (ABCDEA) such as point (A) are not part of the quaternary cubic spinel system as that point contains no manganese. Similarly, points along line (BC) are excluded because they lack both nickel and cobalt. Points along line (DE) are also excluded since they lack copper. Similarly, in polygon (QRSTQ), points along line (ST) are excluded since they lack copper. However, the area surrounding points (1) (2) (3) are part of the proposed quaternary cubic spinel system. Quaternary cubic spinels within these limiting compositions and along these included boundary compositions are within the scope of the proposed invention.

Stated another way, in accordance with the present invention, the amount of $Mn_2O_3$ useful in accordance with the present invention ranges from greater than zero to less than about 76.47 Mol %, and more preferably, between about 20.00 and less than about 45.00 Mol %. The amount of CuO useful ranges from between greater than zero and less than about 50.00 Mol % and more preferably, between greater than zero and about 33.33 Mol %. The amount of MO will range from between greater than zero and less than about 100.00 Mol %. More preferably, MO will be provided in between about 35.00 and less than about 57.00 Mol %. The amount of NiO in MO can range from greater than zero and less than about 57.00 Mol %. Preferably, the amount of NiO ranges from between about 35.00 to less than about 57.00 Mol %. The amount of CoO in MO can range from greater than zero and less than about 100.00 Mol %. Preferably, it ranges from between about 35.00 to less than about 70.00 Mol %.

In accordance with the present invention, quaternary cubic spinel crystals are produced. These monocrystals contain, at the very least, nickel, manganese, cobalt and copper oxide in a predetermined and/or desired ratio. Of course, it is possible for the cubic spinel monocrystals to include other metal oxides, and indeed, other elements or compounds either in partial substitution for one or more of the materials previously described or in addition thereto. Cubic spinel monocrystals containing these additional materials within their crystal structure are specifically contemplated hereby. In addition, the crystals can be layered, doped or otherwise treated.

Figure 2:
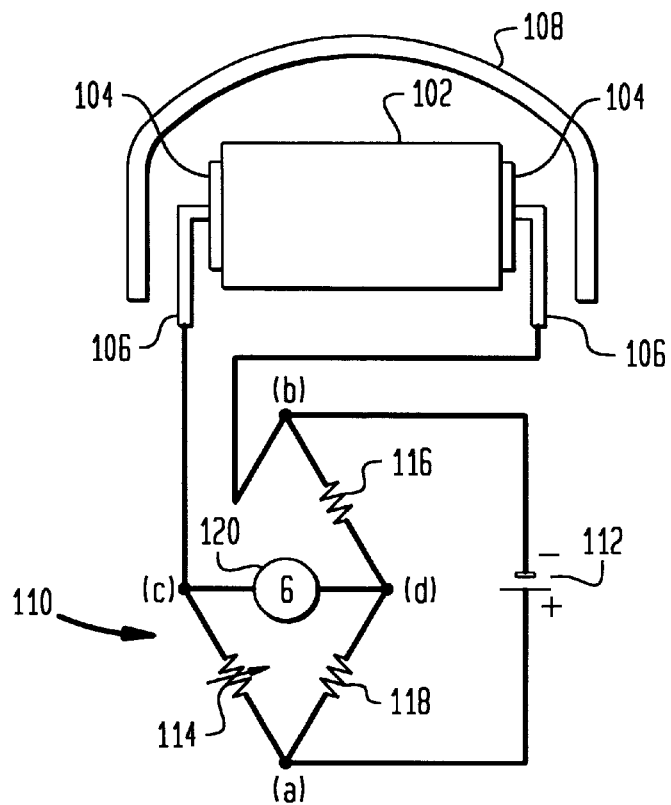
FIG. 2 is a diagrammatic view depicting a sensor in accordance with an embodiment of the invention.

Successfully producing the preferred quaternary cubic spinel monocrystals, within the boundary conditions for the Mn, Co, Cu and Ni oxide system, is an achievement in and of itself. However, the electrical properties of the resulting material must still be checked to see if they actually offer advantages over the corresponding polycrystals. One way to check these properties and indeed, to use the crystals is to create a sensor from them. A sensor in accordance with the present invention is illustrated in FIG. 2. The sensor includes a sensing element 102 consisting of a monocrystalline nickel-cobalt-copper-manganese oxide spinel made in accordance with the above-described embodiments of the invention and a means for transmitting sensing information from the sensing element 102 to, for example, a detector or other measuring device. This means for transmitting can transmit any change in, for example, the physical/electrical properties (i.e., resistance, resistivity, resistence and the like) of the sensing element when it is exposed to a temperature or change in temperature. The means for transmitting sensing information such as physical and electrical properties of the sensing element 102 can be a transceiver or an induction coil or it can be and a pair of electrical terminals 104 in substantially ohmic contact with the sensing element. Terminals 104 can be formed from noble metals and their alloys, copper, and aluminum and their alloys. Platinum, palladium and gold, and their alloys are particularly preferred. The metallic terminals can be applied by sputtering the metal of the terminal onto the spinel, or by electroplating, electroless plating, painting with a metallic paint or pressurized contact so that the metal of the terminal is in intimate contact with the spinel. Leads 106 are connected to the terminals by welding. Sensing element 102, contacts 104 and leads 106 are enclosed in a conventional housing 108, of which only a portion is illustrated in FIG. 2.

Leads 106, and hence the sensing element, are connected to an electrical resistance measuring device 110 adapted to measure the electrical impedance including resistivity, resistance and the like through the sensing element. The particular resistance-measuring device illustrated in FIG. 2 is a Wheatstone bridge, incorporating a battery 112; a variable resistor 114 in branch (ac) with the sensing element 102 in branch (cb); resistors 118 and 116 form connecting branches (ad) and (db), respectively. The galvanometer 120 forms connecting branch (cd). The circuit can be used to measure an unknown temperature by exposing the housing 108, and hence sensing element 102, to the unknown temperature, and adjusting resistor 114 until the bridge is in balance, whereupon galvanometer 120 shows no current flow. The resistance required to bring the bridge into balance is a measure of the resistance through the sensing element, and hence a measure of the unknown temperature. Many other conventional resistance-measuring instruments can be used in place of the Wheatstone bridge. For example, a conventional ohmmeter can be employed.

Impedance temperature characteristics of the monocrystals of the present invention prepared as explained in Example II can be obtained for 65 frequencies ranging from (5 to 13 million) Hz with a Hewlett-Packard 4192A Impedance Analyzer. Not only can dielectric and transport properties such as permittivity and electric conductivity be obtained but the quality of the monocrystal itself is related to the impedance spectra at a given temperature. When the impedance (z) of a material is plotted in terms of its series capacitive reactance (Xs) against its series resistance (Rs) over this frequency range at constant temperature it generates semi-circular shaped curves. The existence of only a single (undistorted) circular (z) arc, taken at temperatures of (−4° C.) or of (25° C.) can confirm the good quality of a monocrystal. See *Impedance Spectroscopy* Edited by J. Ross Macdonald, John Wiley and Sons, (1987) and especially Chapters 1 and 4 thereof which are hereby incorporated by reference.[8]

Figure 3:
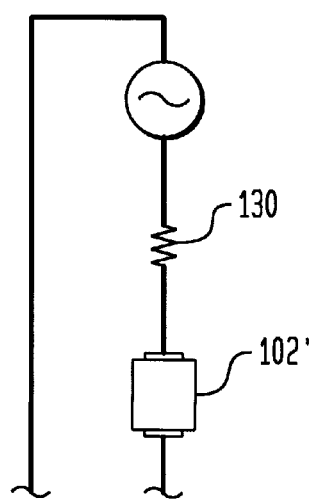
FIG. 3 is a diagrammatic view depicting an electrical circuit in accordance with the invention.

The sensing element can also be used to provide temperature compensation in an electrical circuit. For example, an electronic circuit, as shown in FIG. 3, may include resistor 130 connected in series with sensing element 102' similar to the sensing element discussed above, and further connected to other circuit components (not shown). When the circuit is exposed to changes in ambient temperature, the resistance of resistor 130 tends to increase with increasing temperature. The decrease in resistance of sensing element 102' compensates for such increase. The variation in impedance of the sensing element with temperature can be used to compensate for changes in properties of other electronic components, such as semiconductors, capacitors, inductors and the like. See generally the 1993 Thermometrics' Catalog, entitled "Worldwide Capability in Thermistors." The text of which is also incorporated by reference[7]. Sensing elements according to this aspect of the proposed invention are particularly useful in circuits driven with alternating currents above about 10 Hz, and even more useful at higher frequencies. In contrast to polycrystalline sensors, the sensors according to this aspect of the proposed invention have substantially greater change in impedance with frequency than polycrystalline sensing elements.[1][2] Thermistors can operate between at least approximately −90 to 570° C.

The foregoing will be better understood with reference to the following examples. All references made to these examples are for the purposes of illustration. They are not to be considered limiting as to the scope and nature of the present invention.

EXAMPLE I

Monocrystals of nickel-cobalt-copper-manganese oxide having a quaternary cubic spinel structure are grown in solutions of molten mixtures of bismuth and boron oxides (flux). Three crucibles (C1, C2 and C3) are individually charged with predetermined amounts of starting materials as indicated in Tables 2–5. Table 2 presents the moles of starting materials for 0.55 moles of solute plus flux. Table 3 identifies the amounts of the metal oxide starting materials charged to each platinum crucible in mole percent relative to the solute only. Table 4 gives their formulations with a 70.00 mole percent (m/o) concentration of flux (solvent) having a ratio of $(B_2O_3:Bi_2O_3)=(19:81)$ m/o for compositions in crucibles 1, 2 and 3. Table 5 identifies the actual weights of the components to be charged to each crucible. To add $B_2O_3$ to the mixture it is easier to use boric acid ($H_3BO_3$) because it is not hygroscopic and because it transforms into $B_2O_3$ when heated, according to the equation $2H_3BO_3 \rightarrow B_2O_3 + 3H_2O$.

TABLE 2

Moles of Starting Materials for 0.550 moles of Solute Plus [Flux ($B_2O_3$ + $Bi_2O_3$)]

|  | $C_1$ | $C_2$ | $C_3$ |
| --- | --- | --- | --- |
| NiO | 0.0316 | 0.0281 | 0.0246 |
| $Mn_2O_3$ | 0.0456 | 0.0456 | 0.0456 |
| CoO | 0.0597 | 0.0562 | 0.0527 |
| CuO | 0.0281 | 0.0351 | 0.0421 |
| $Bi_2O_3$ | 0.3119 | 0.3119 | 0.3119 |
| $B_2O_3$ | 0.0732 | 0.0732 | 0.0732 |

TABLE 3

Starting Material as Initial Mole Percent (m/o)$_i$ Relative to Solute

|  | Initial Material (m/o)$_i$ | | | |
| --- | --- | --- | --- | --- |
| $C_k$* | NiO | $Mn_2O_3$ | CoO | CuO |
| 1 | 19.1489 | 27.6596 | 36.1702 | 17.0213 |
| 2 | 17.0213 | 27.6596 | 34.0426 | 21.2766 |
| 3 | 14.8936 | 27.6596 | 31.9149 | 25.5319 |

*$C_k$ is the symbol for Crucible number k which ranges from k = 1 to 3

TABLE 4

Starting Material as Initial Mole Percent (m/o)$_i$ Relative to the Solute Plus the Solvent

|  | Initial Material (m/o)$_i$ | | | | | |
| --- | --- | --- | --- | --- | --- | --- |
| $C_k$* | NiO | $Mn_2O_3$ | CoO | CuO | $B_2O_3$ | $Bi_2O_3$ |
| 1 | 5.7447 | 8.2979 | 10.8511 | 5.1064 | 13.3000 | 56.7000 |
| 2 | 5.1064 | 8.2979 | 10.2128 | 6.3830 | 13.3000 | 56.7000 |
| 3 | 4.4681 | 8.2979 | 9.5745 | 7.6596 | 13.3000 | 56.7000 |

*$C_k$ is the symbol for Crucible number k which ranges from k = 1 to 3

TABLE 5

Weights of Starting Materials for 0.55 Moles

|  | **Starting Material [gm] | | | | | |
| --- | --- | --- | --- | --- | --- | --- |
| $C_k$* | NiO | $Mn_2O_3$ | $Co_3O_4$ | CuO | $H_3BO_3$ | $Bi_2O_3$ |
| 1 | 2.3599 | 7.2051 | 4.7903 | 2.2340 | 9.0462 | 145.3093 |
| 2 | 2.0977 | 7.2051 | 4.5085 | 2.7926 | 9.0462 | 145.3093 |
| 3 | 1.8355 | 7.2051 | 4.2268 | 3.3511 | 9.0462 | 145.3093 |

*$C_k$ is the symbol for Crucible number k which ranges from k = 1 to 3

For each of the compositions crucibles 1, 2, 3 this protocol is followed. Three 50 ml platinum crucibles are provided. Into each, the appropriate amounts of NiO, $Co_3O_4$, CuO, $Mn_2O_3$, $H_3BO_3$ and $Bi_2O_3$, as indicated in Table 5 are weighed out and charged. An equilibrium between the material in the crucible and the oxygen in the atmosphere in the furnace is desirable, so the crucibles should not be tightly covered. In fact, each platinum cover should have a 0.3175 cm hole in its center. Then the crucibles are placed into a furnace and heated to a top temperature of 1280° C. and are soaked at that temperature for about 60 hours. After soaking, the crucibles are cooled to a second elevated temperature of 860° C. at a rate of 0.6° C. per hour. At the second elevated temperature, the contents of the crucibles 1, 2 and 3 contain crystals. When the second elevated temperature is attained, the crucibles should be cooled to ambient temperature. The monocrystals are recovered by treatment with 15 volume percent acetic acid to dissolve the flux.

EXAMPLE II

To manufacture sensors developed from the materials grown in the crucibles, one could proceed as follows. The monocrystals are recovered from the flux and cleaned. Electrical contact(s) are made by applying a dab of Dupont 4922N silver paint mixed with butyl acetate onto a face of a specimen, and drying this contact at 100° C. for 10 minutes. The contacts are cured at 200° C. for 1 hour. One mil Pt wires are soldered on to the fired ink spots. The change in the DC resistance of the material at various temperatures is determined in order to illustrate the thermistor property.

These monocrystals, with no grain boundaries, have greatly reduced dispersion effects, faster electric relaxation times and thermal response times. Clearly, the absence of charge carrier-grain boundary scattering results in electric field effects and transport processes that differ from the ceramic counterparts. The intergranular structure of the ceramic polycrystal makes these physical properties unpredictable, and more difficult to understand and control than those of monocrystals. It appears that a standard thermistor now can be prepared from a single crystal and used to evaluate the performance of ceramic devices.

The principles, preferred embodiments and modes of operation of the present invention have been described in the foregoing specification. The invention which is intended to be protected herein, however, is not to be construed as limited to the particular embodiments disclosed, since these are to be regarded as illustrative rather than restrictive. Variations and changes may be made by others without departing from the spirit and scope of the invention.

BIBLIOGRAPHY

The text of the references and in particular, the pages indicated below are hereby incorporated by reference.

(1) E. G. Larson, R. J. Arnott, D. G. Wickham, "Preparation, Semi-Conduction and Low Temperature Magnetization of the System $Ni_{1-x}Mn_{2+x}O_4$", *J. Physics and Chemistry Solids*, Vol. 23, (1962), 1771–1781.

(2) K. J. Standley, Oxide Magnetic Materials, Monographs On The Physics and Chemistry of Materials. 2nd. ed., Clarendon Press. Oxford (1972), pp. 140.

(3) D. G. Wickham, "Solid-Phase Equilibria In The System $NiO—Mn_2O_3—O_2$", *J. Inorg. Nucl. Chem.*, 26, (1964), 1369–1377.

(4) E. M. Levin and Clyde McDaniel, *J. Amer. Ceram. Soc.*, 45,[8] 356 (1962).

(5) D. G. Wickham, "The Chemical Compositions of Spinels in the System $Fe_3O_4—Mn_3O_4$" *J. Inorg. Nucl. Chem.* 31, 313(1969).

(6) A. E. Paladino, Jr., "Phase Equilibria in Ferrite Region of the System Fe—Ni—O", *J. Am. Ceram. Soc.*, 42[4] 168–75(1959).

(7) 1993 Thermometrics Catalog—"Worldwide Capability in Thermistors."

(8) J. Ross Macdonald, Editor, *Impedance Spectroscopy* John Wiley and Sons (1987). Chapters 1 and 4.

We claim:

1. A monocrystal comprising at least nickel-cobalt-copper-manganese oxide having a cubic spinel structure.

2. The monocrystal of claim 1 having an atomic ratio $R=Mn/(Ni+Co+Cu+Mn)$ which ranges from greater than zero to less than about 0.87 based on Mn.

3. The monocrystal of claim 1 wherein said crystal has a quaternary cubic spinel structure.

4. A monocrystal of nickel-manganese-cobalt-copper oxide having a quaternary cubic spinel structure and composition in the region of solid solutions bounded by the lines connecting the polygon ABCDEA in FIG. 1.

5. A monocrystal of nickel-manganese-cobalt-copper oxide having a quaternary cubic spinel structure and composition in the region of solid solutions bounded by the lines connecting the polygon QRSTQ in FIG. 1.

6. A sensor capable of detecting temperature within a range between about −90° C. and about 570° C. comprising a sensing element consisting of monocrystalline nickel-cobalt-copper-manganese oxide having cubic spinel structure and a means for transmitting sensing information from said sensing element responsive to the temperature of said sensing element.

7. The sensor of claim 6 wherein said means for transmitting sensing information is a pair of terminals in contact with said sensing element, whereby electrical resistance between said terminals will vary with the temperature of said sensing element.

8. A sensor as claimed in claim 7 wherein said terminals are in substantially ohmic contact with said element.

9. A sensor as claimed in claim 7 wherein said terminals are formed from metals selected from the group consisting of noble metals and their alloys and copper and its alloys.

10. The sensor of claim 7 further comprising a pair of leads, one of said leads being connected respectively to one of said terminals.

11. The sensor of claim 7 further comprising a housing supporting and enclosing at least a portion of said element.

12. The sensor of claim 7 further comprising means for measuring the electrical impedance between said terminals and thereby measure the temperature of said element.

* * * * *

UNITED STATES PATENT AND TRADEMARK OFFICE
CERTIFICATE OF CORRECTION

PATENT NO.   :   6,027,246
DATED        :   February 22, 2000
INVENTOR(S)  :   Rosen, et.al.

It is certified that error appears in the above-identified patent and that said Letters Patent is hereby corrected as shown below:

Column 7, line 45, "resistance" should read --impedance.

Column 7, line 45, "resistence" should read --resistance--.

Column 12, line 2, after "having" insert --a--.

Signed and Sealed this

Twenty-seventh Day of February, 2001

Attest:

NICHOLAS P. GODICI

Attesting Officer

Acting Director of the United States Patent and Trademark Office